United States Patent
Zou

(10) Patent No.: US 10,773,950 B2
(45) Date of Patent: Sep. 15, 2020

(54) MEMS MICROPHONE DEVICE AND ELECTRONICS APPARATUS

(71) Applicant: GOERTEK. INC, Shandong (CN)

(72) Inventor: Quanbo Zou, Shandong (CN)

(73) Assignee: WEIFANG GOERTEK MICROELECTRONICS CO., LTD., Weifang (CN)

(*) Notice: Subject to any disclaimer, the term of this patent is extended or adjusted under 35 U.S.C. 154(b) by 0 days.

(21) Appl. No.: 16/339,455

(22) PCT Filed: Oct. 8, 2016

(86) PCT No.: PCT/CN2016/101473
§ 371 (c)(1),
(2) Date: Apr. 4, 2019

(87) PCT Pub. No.: WO2018/064803
PCT Pub. Date: Apr. 12, 2018

(65) Prior Publication Data
US 2020/0039816 A1   Feb. 6, 2020

(51) Int. Cl.
*H04R 19/04* (2006.01)
*B81B 7/00* (2006.01)

(52) U.S. Cl.
CPC .......... *B81B 7/0061* (2013.01); *H04R 19/04* (2013.01); *B81B 2201/0257* (2013.01);
(Continued)

(58) Field of Classification Search
CPC .......... B81B 7/0061; B81B 2201/0257; H04R 19/04; H04R 2201/003; H04R 2307/023; H04R 2307/025; H04R 2307/027
See application file for complete search history.

(56) References Cited

U.S. PATENT DOCUMENTS 5,573,679 A * 11/1996 Mitchell ............. B81C 1/00595
216/2
8,447,057 B2   5/2013 Goida et al.
(Continued)

FOREIGN PATENT DOCUMENTS

CN   204334948 U   5/2015
CN   104760924 A   7/2015
(Continued)

OTHER PUBLICATIONS

L Buchaillot et al., Silicon Nitride Thin Films Young's Modulus Determination by an Optical Non Destructive Method, 36 Jpn. J. Appl Phys. 794, 796 (Jun. 15, 1997) (Year: 1997).*
(Continued)

*Primary Examiner* — Walter F Briney, III
(74) *Attorney, Agent, or Firm* — Miles & Stockbridge P.C.; Ajay Jagtiani

(57) ABSTRACT

An MEMS microphone device and an electronics apparatus are provided. The MEMS microphone device comprises: a substrate; a MEMS microphone element placed on the substrate; a cover encapsulating the MEMS microphone element together with the substrate; and an acoustic port for the MEMS microphone element, wherein a compliant membrane is provided to seal the acoustic port, and the membrane has a mechanical stiffness lower than that of the diaphragm of the MEMS microphone element.

9 Claims, 2 Drawing Sheets

(52) U.S. Cl.
CPC .. *H04R 2201/003* (2013.01); *H04R 2307/023* (2013.01); *H04R 2307/025* (2013.01); *H04R 2307/027* (2013.01)

(56) References Cited

U.S. PATENT DOCUMENTS

| 2014/0044297 | A1* | 2/2014 | Loeppert | H04R 1/086 |
| | | | | 381/355 |
| 2016/0261941 | A1* | 9/2016 | Brioschi | H04R 19/04 |
| 2017/0041706 | A1* | 2/2017 | Evans | H04R 1/086 |

FOREIGN PATENT DOCUMENTS

| CN | 204733381 U | 10/2015 |
| JP | H08307990 A | 11/1996 |

OTHER PUBLICATIONS

G. Zhu et al., Thermal Treatment of Expanded Polytetrafluoroethylene (ePTFE) Membranes for Reconstruction of a Valved Conduit, 26 Bio-Medical Materials and Eng'g S55, S58 (2015) (Year: 2015).*

* cited by examiner

MEMS MICROPHONE DEVICE AND ELECTRONICS APPARATUS

CROSS-REFERENCE TO RELATED APPLICATIONS

This application is a National Stage of International Application No. PCT/CN2016/101473 filed on Oct. 8, 2016 which is hereby incorporated by reference in its entirety.

FIELD OF THE INVENTION

The present invention relates to the field of MEMS microphone, and more specifically, to a MEMS microphone device and an electronics apparatus.

BACKGROUND OF THE INVENTION

A Micro-Electro-Mechanical System, or MEMS, is a technology that in its most general form can be defined as miniaturized mechanical and electro-mechanical elements (i.e., devices and structures) that are made using the techniques of micro-fabrication. A MEMS microphone element is a microphone made by the MEMS technology. A MEMS microphone element can be first manufactured and then it is encapsulated into a MEMS microphone device on a substrate. The MEMS microphone device can further be assembled into an electronics apparatus such as a mobile phone, a pad, a laptop and so on.

Because of the small size of the MEMS microphone element, the environment of manufacturing will influence the performance of an electronics apparatus which has a MEMS microphone device.

Generally, a MEMS microphone device has an acoustic port to let the sound pressure come into the MEMS microphone element and interact with its diaphragm. Dusts or particles can enter the acoustic port and thus the performance of the MEMS microphone device may be degraded.

In the prior art, some technicians use a filter with mesh holes at the acoustic port to protect the MEMS microphone element. In order to relieve the influence of the dust or particle, technicians try to reduce the size of the mesh holes of the acoustic port or to use a rigid plate filter for the acoustic port. However, this will degrade the performance of the MEMS microphone device, such Signal-Noise-Ratio (SNR).

In addition, due to fabrication process constraints, it is just feasible to fabricate very large mesh holes currently, for example, the sizes of which are about 100 µm or more. By using such a filter, killer particles for a MEMS microphone element of 2~5 µm, such as PM 2.5 particles, cannot be blocked out efficiently.

Furthermore, the dimension of such a filter will influence the performance of the MEMS microphone device. For example, with the increasing of the thickness of the filter, the SNR may decrease. For example, with the size reduction of the mesh holes of the filter, the SNR may also decrease. For example, with the thickness increase of the filter, the frequency response of the MEMS microphone device may be deviated.

U.S. Pat. No. 9,438,972 B2 discloses a Silicon based MEMS microphone, a system and a package with the same, which is hereby incorporated herein by reference.

U.S. Pat. No. 8,447,057 B2 discloses packages and methods for packaging MEMS microphone devices, which is hereby incorporated herein by reference.

X. Yang, et al, Micromachined membrane particle filters, p. 137-142, Micro Electro Mechanical Systems Conference, February 1998 discloses several particle membrane filters with circular, hexagonal and rectangular through holes, which is hereby incorporated herein by reference.

Therefore, there is a demand in the art that a new solution for a MEMS microphone device shall be proposed to address at least one of the problems in the prior art.

SUMMARY OF THE INVENTION

One object of this invention is to provide a new technical solution for a MEMS microphone device.

According to a first aspect of the present invention, there is provided a MEMS microphone device, comprising: a substrate; a MEMS microphone element placed on the substrate; a cover encapsulating the MEMS microphone element together with the substrate; and an acoustic port for the MEMS microphone element, wherein a compliant membrane is provided to seal the acoustic port, and the membrane has a mechanical stiffness lower than that of the diaphragm of the MEMS microphone element.

Optionally or alternatively, the acoustic port is provided in the substrate or the cover.

Optionally or alternatively, an ASIC for the MEMS microphone element is also sealed by the substrate, the cover and the compliant membrane.

Optionally or alternatively, the compliant membrane is made of at least one of the followings: silicon, polysilicon, silicon nitride, silicon oxide, polymer, plastics, elastomer, metal, alloy, metallic glass, or dielectrics, which have a higher elongation or ultimate strength than that of silicon materials.

Optionally or alternatively, the compliant membrane has a Young's modulus of less than 100 GPa.

Optionally or alternatively, the compliant membrane is flat or is pre-buckled in rest position.

Optionally or alternatively, the compliant membrane is air permeable.

Optionally or alternatively, the compliant membrane is water-proofing.

Optionally or alternatively, the substrate is a printed circuitry board or flexible PCB.

According to a second aspect of the present invention, there is provided an electronics apparatus comprising a MEMS microphone device according to the present invention.

According to an embodiment of this invention, the present invention can reduce the influence of the outside particles on the MEME microphone element.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
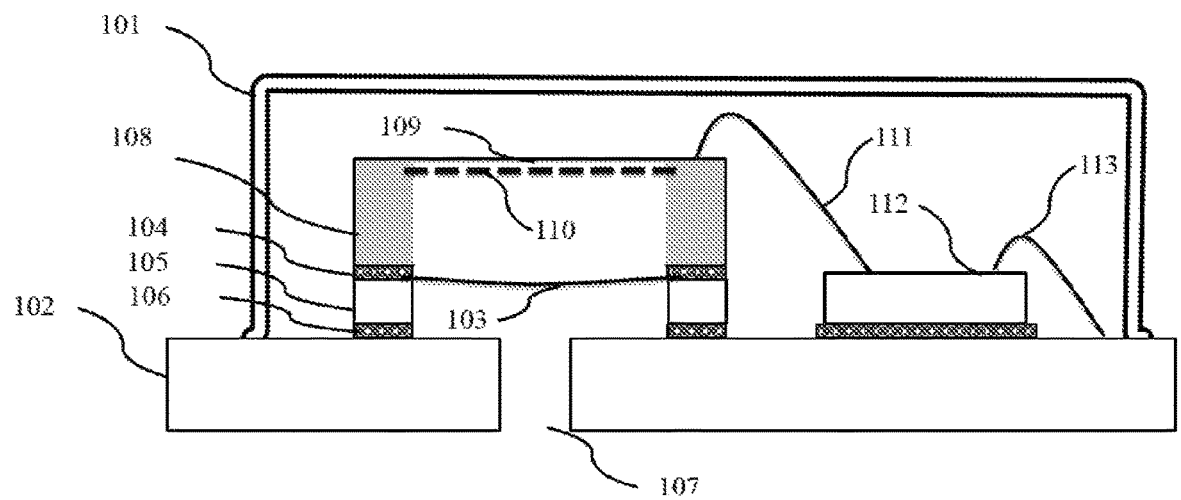
FIG. 1 is a schematic diagram of a MEMS microphone device according to a first embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In this invention, the inventors have proposed to use a compliant membrane at an acoustic port of a MEMS microphone device to relieve the impact of particles (or dust) on the performance of the device.

Embodiments of this invention will be described with reference to the drawings.

First Embodiment

FIG. 1 shows a schematic diagram of a MEMS microphone device according to a first embodiment of the present invention.

As shown in FIG. 1, the MEMS microphone device comprises a substrate 102, a MEMS microphone element 108, a cover 101 and an acoustic port 107 for the MEMS microphone element 108. The MEMS microphone element 108 is placed on the substrate 102. The cover 101 encapsulates the MEMS microphone element 108 together with the substrate 102.

As shown in FIG. 1, a compliant membrane 103 is provided to seal the acoustic port 107. The membrane 103 has a mechanical stiffness lower than that of the diaphragm 109 of the MEMS microphone element 108.

Generally, the environment of manufacturing a MEMS microphone device can be kept clean (or dust-free). However, it is difficult to maintain a clean environment during transportation to another place and assembling it into an electronics apparatus. In the prior art, dust or particles can enter the MEMS microphone element via the acoustic port and thus the performance of the MEMS microphone device is degraded.

In addition, in the prior art, a filter with small holes is used to filter particle. On the one hand, it is difficult to manufacture the filter with very small holes. It may increase the cost. On the other hand, when the holes get smaller, they will cause an additional noise, which will degrade the performance such as SNR.

In the embodiment, a compliant membrane is used to block or filter dust or particles at the acoustic port. In this way, particles can be blocked at the acoustic port. In the later procedures of manufacture such assembly of an electronics apparatus, the environment requirement will not be so strict and thus the cost may be reduced.

Furthermore, during usage of the electronics apparatus, the MEMS microphone device may maintain in a better condition because of the sealing of the compliant membrane. This will be benefit to the user. For example, the mesh holes of the above-said prior art filter may be blocked by larger particles. In this situation, the performance of the MEMS microphone device may be degraded drastically.

For example, the compliance of the membrane can be much higher than that of the diaphragm of the MEMS microphone element. That is, the mechanical stiffness of the membrane 103 is much lower than that of the diaphragm 109 of the MEMS microphone element 108.

Generally, the MEMS microphone element is made of silicon, the Young's modulus of which is about 170 GPa. Because the compliance of the membrane will be inversely proportional to its Young's modulus, the material of the membrane 103 can have a Young's modulus lower than that of the diaphragm 109 in case that the membrane 103 has a similar size and thickness as of the diaphragm 109. For example, the compliant membrane 103 has a Young's modulus of less than 100 GPa; preferably less than 50 GPa; and further preferably less than 20 GPa.

For example, it can be silicon, polysilicon, silicon nitride, silicon oxide, polymer, plastics, elastomer, metal, alloy, metallic glass, or dielectrics, which have a higher elongation or ultimate strength than that of silicon materials.

Preferably, a thin film of polymer/plastics with Young's modulus of 100 kPa-20 GPa can be used.

Preferably, the compliant membrane 103 is flat in rest position. Alternatively, the compliant membrane 103 is pre-buckled in rest position. For example, the compliant membrane 103 has a low initial in-plane tensile stress through compressive.

In an example, the compliant membrane 103 is air permeable so that the ambient pressures in two sides of the membrane can be balanced. In this way, the influence by the ambient changes will be reduced or relieved.

For example, the compliant membrane can be waterproofing. In this way, a water-proofing electronics apparatus can be made and/or the likelihood that the microphone device of an electronics apparatus is damaged by water or humidity is lowered.

In this embodiment, the compliant membrane dust not have a ventilation hole and thus water-proofing and/or dust-proofing can be achieved.

As shown in FIG. 1, the MEMS microphone device also includes a ASIC 112 for the MEMS microphone element 108. The ASIC is also sealed by the substrate 102, the cover 101 and the compliant membrane 103.

In this embodiment, the acoustic port 107 is provided in the substrate 102, for example. The substrate 102 can be a printed circuitry board or flexible PCB.

As shown in FIG. 1, the compliant membrane 103 is attached to a support 105. The support 105 is sandwiched between the substrate 102 and the MEMS microphone element 108 via die attachment 104, 106 such as glue. The MEMS microphone element 108 has a flexible diaphragm 109 and a rigid backplate 110, for example. The MEMS microphone element 108 is connected to the ASIC 112 via wire 111 and the ASIC is connected to the substrate 102 via wire 113.

Second Embodiment

Figure 2:
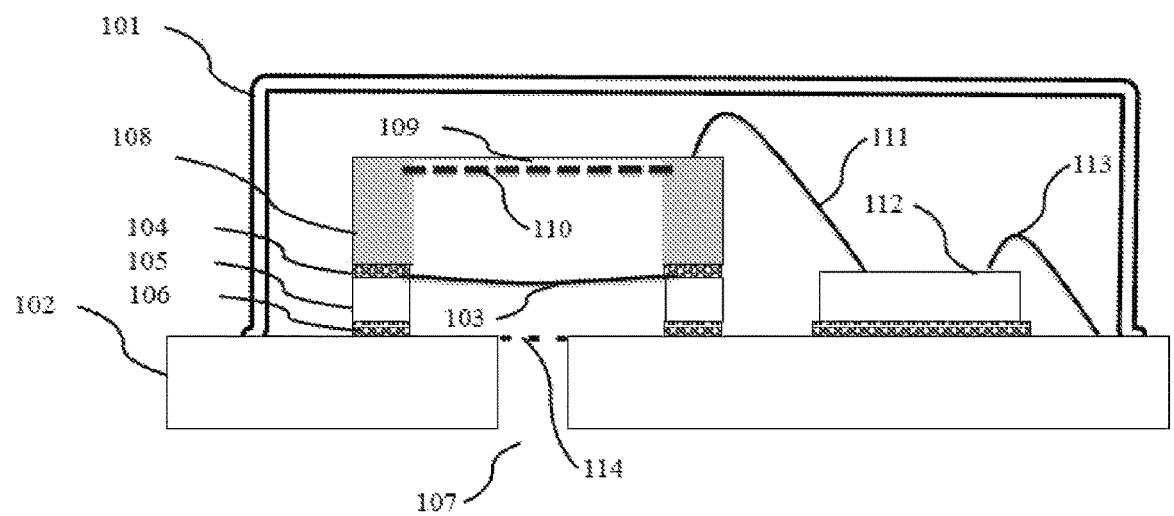
FIG. 2 is a schematic diagram of a MEMS microphone device according to a second embodiment of the present invention.

FIG. 2 shows a schematic diagram of a MEMS microphone device according to a second embodiment of the present invention. The MEMS microphone device in FIG. 2 is similar with that in FIG. 1. The repetitive parts in FIG. 2 are marked with the same reference numbers and thus the description thereof are omitted.

In the embodiment of FIG. 2, a filter 114 of the prior art can be provided at the acoustic port 107 together with the compliant membrane 103. In this way, the performance of the device may further be improved.

Third Embodiment

It would be understood by a person skilled in the art, although FIGS. 1 and 2 shows the acoustic port 107 is provided in the substrate 102, it can be also provided in the cover 101.

Figure 3:
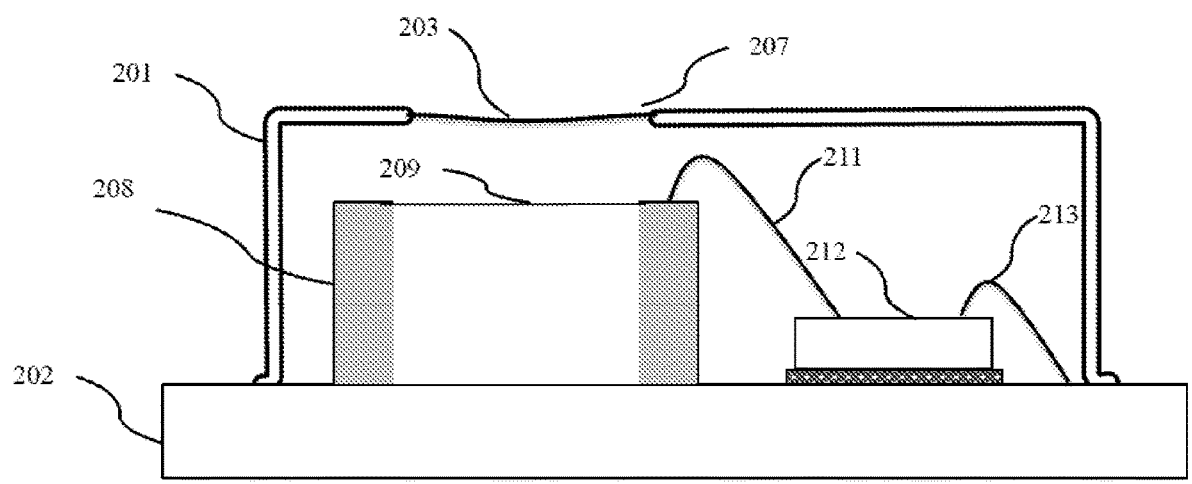
FIG. 3 is a schematic diagram of a MEMS microphone device according to a third embodiment of the present invention.

FIG. 3 shows a schematic diagram of a MEMS microphone device according to a third embodiment of the present invention, in which a acoustic port 207 is provided in the cover 201.

As shown in FIG. 3, the cover 201 is mounted on the substrate 202. The MEMS microphone element 208 with a diaphragm 209 is placed on the substrate 202 and is encapsulated by the cover 201 and the substrate 202.

A acoustic port 207 is provided in the cover 201. A compliant membrane 203 is provided to seal the acoustic port 207. The membrane 203 has a mechanical stiffness lower than that of the diaphragm 209 of the MEMS microphone element 208.

The description for repetitive parts in FIG. 3 are omitted.

In the embodiments of the present invention, the prior art filter with mesh holes can be omitted. However, it can also be conceived that the prior art filter with mesh holes and the compliant membrane can be combined in a MEMS microphone device. This may provide a further effect. For example, the prior art filter with mesh holes is provided at the acoustic port and the compliant membrane is provided between the filter and the MEMS microphone element.

Fourth Embodiment

The MEMS microphone device according to any embodiment of this invention can be used in an electronics apparatus such as a mobile phone, a pad, a laptop and headset and so on.

Although some specific embodiments of the present invention have been demonstrated in detail with examples, it should be understood by a person skilled in the art that the above examples are only intended to be illustrative but not to limit the scope of the present invention.

What is claimed is:

1. A MEMS microphone device, comprising:
   a substrate;
   a MEMS microphone element placed on the substrate;
   a cover encapsulating the MEMS microphone element together with the substrate; and
   an acoustic port for the MEMS microphone element,
   wherein a compliant membrane is provided to seal the acoustic port, and the membrane has a mechanical stiffness lower than that of the diaphragm of the MEMS microphone element,
   wherein a support is attached to the substrate via a second die attachment, the MEMS microphone element is attached to the support via a first die attachment, the compliant membrane is sandwiched between the first die attachment and the support to suspend, a suspended length of the compliant membrane is equal to a length of a diaphragm of the MEMS microphone element,
   wherein the compliant membrane is pre-buckled in rest position, and has a low initial in-plane tensile stress through compressive,
   wherein the compliant membrane does not have a ventilation hole.

2. The MEMS microphone device according to claim 1, wherein the acoustic port is provided in the substrate or the cover.

3. The MEMS microphone device according to claim 1, wherein an ASIC for the MEMS microphone element is also sealed by the substrate, the cover and the compliant membrane.

4. The MEMS microphone device according to claim 1, wherein the compliant membrane is made of at least one of the followings: silicon, polysilicon, silicon nitride, silicon oxide, polymer, plastics, elastomer, metal, alloy, metallic glass, or dielectrics, which have a higher elongation or ultimate strength than that of silicon materials.

5. The MEMS microphone device according to claim 1, wherein the compliant membrane has a Young's modulus of less than 100 GPa.

6. The MEMS microphone device according to claim 1, wherein the compliant membrane is air permeable.

7. The MEMS microphone device according to claim 1, wherein the compliant membrane is water-proofing.

8. The MEMS microphone device according to claim 1, wherein the substrate is a printed circuitry board or flexible PCB.

9. An electronics apparatus comprising a MEMS microphone device according to claim 1.

* * * * *